United States Patent
Okamoto et al.

(10) Patent No.: US 9,952,505 B2
(45) Date of Patent: Apr. 24, 2018

(54) IMPRINT DEVICE AND PATTERN FORMING METHOD

(71) Applicant: TOSHIBA MEMORY CORPORATION, Minato-ku (JP)

(72) Inventors: Yosuke Okamoto, Sagamihara (JP); Nobuhiro Komine, Nagoya (JP); Kazuhiro Segawa, Kuwana (JP); Manabu Takakuwa, Tsu (JP); Kentaro Kasa, Kawasaki (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 679 days.

(21) Appl. No.: 14/481,381

(22) Filed: Sep. 9, 2014

(65) Prior Publication Data
US 2015/0251350 A1 Sep. 10, 2015

(30) Foreign Application Priority Data
Mar. 4, 2014 (JP) ................... 2014-041697

(51) Int. Cl.
*B29C 59/02* (2006.01)
*G03F 7/00* (2006.01)

(52) U.S. Cl.
CPC ................... *G03F 7/0002* (2013.01)

(58) Field of Classification Search
CPC ...... B29C 59/02; B29C 59/026; G03F 7/0002
(Continued)

(56) References Cited

U.S. PATENT DOCUMENTS 6,248,498 B1 * 6/2001 Gybin .................. G03F 7/0388
430/176
7,632,088 B2 * 12/2009 Pethica ................. B29C 43/003
264/293
(Continued)

FOREIGN PATENT DOCUMENTS

JP  2011-35408 A  2/2011
JP  2011-91307 A  5/2011
(Continued)

OTHER PUBLICATIONS

Office Action dated Sep. 9, 2016 in Korean Patent Application No. 10-2015-0022232 (with English language translation).
(Continued)

*Primary Examiner* — Christina Johnson
*Assistant Examiner* — Xue Liu
(74) *Attorney, Agent, or Firm* — Oblon, McClelland, Maier & Neustadt, L.L.P.

(57) ABSTRACT

According to one embodiment, an imprint device includes a holding unit, a mounting unit, a moving unit, a curing unit, a pressing portion, and a detecting portion. The holding unit holds template having a pattern portion pressed onto a transfer portion provided on a substrate. The mounting unit mounts the substrate. The moving unit is provided on at least either the holding unit or the mounting unit. The moving unit moves the holding unit and the mounting unit in directions approaching each other or directions away from each other. The curing unit cures the transfer portion onto which the pattern portion of the template is pressed. The pressing portion pushes the template pressed onto the transfer portion in a direction intersecting a pressing direction of the template. The detecting portion detects a position of the template pushed by the pressing portion.

7 Claims, 2 Drawing Sheets

RESIDUAL FILM THICKNESS DIMENSION
THIN ⟷ THICK

(58) Field of Classification Search
USPC .......................................................... 264/293
See application file for complete search history.

(56) References Cited

U.S. PATENT DOCUMENTS

| | | | |
|---|---|---|---|
| 2010/0044917 A1* | 2/2010 | Kruijt-Stegeman | ... B82Y 10/00 264/293 |
| 2010/0052217 A1 | 3/2010 | Kasumi | |
| 2011/0097827 A1 | 4/2011 | Hatano et al. | |
| 2011/0187014 A1* | 8/2011 | Taylor | ..................... B29C 59/02 264/40.5 |
| 2012/0007279 A1* | 1/2012 | Torii | ..................... B29C 33/303 264/293 |
| 2013/0015598 A1* | 1/2013 | Kimura | ................. G03F 7/0002 264/40.1 |
| 2013/0020741 A1 | 1/2013 | Suzuki et al. | |
| 2013/0134630 A1 | 5/2013 | Miyata et al. | |

FOREIGN PATENT DOCUMENTS

| | | |
|---|---|---|
| JP | 2013-21155 A | 1/2013 |
| JP | 2013-26436 A | 2/2013 |
| JP | 2015-130448 A | 7/2015 |
| KR | 10-2010-0024898 A | 3/2010 |
| KR | 10-2013-0011914 A | 1/2013 |
| KR | 10-2013-0059293 A | 6/2013 |

OTHER PUBLICATIONS

Michelle L. Gee, et al., "Liquid to solidlike transitions of molecularly thin films under shear", J. Chem. Phys., vol. 93, No. 3, Aug. 1, 1990, pp. 1895-1906.

Notification of Comments dated Apr. 1, 2016 in Korean Patent Application No. 10-2015-0022232 (with English language translation).

* cited by examiner

RESIDUAL FILM THICKNESS DIMENSION
THIN ⟷ THICK

IMPRINT DEVICE AND PATTERN FORMING METHOD

CROSS-REFERENCE TO RELATED APPLICATIONS

This application is based upon and claims the benefit of priority from Japanese Patent Application No. 2014-041697, filed on Mar. 4, 2014; the entire contents of which are incorporated herein by reference.

FIELD

Embodiments described herein relate generally to an imprint device and pattern forming method.

BACKGROUND

In manufacturing electronic devices such as semiconductor devices, patterns are formed using an imprint method.

For example, a pattern composed of a resin material is formed on a substrate by dripping the resin material in a liquid state on the substrate and curing the resin material while a template formed with the pattern (also referred to as an imprint mold or the like) is pressed against the resin material.

Here, when forming the pattern using the imprint method, the resin material is made to remain between a convex portion of the template and the substrate. A thickness of a film (residual film) composed of this remaining resin material is called a residual film thickness (RLT).

If a residual film thickness dimension fluctuates, a processing condition of a process at a post-process (for example, an etching process using the pattern composed of the resin material as a mask) comes to fluctuate, which makes it difficult to apply a high-precision process on a foundation layer of the pattern composed of the resin material.

Because of this, a technique has been proposed that measures a distance between a convex portion of the template and the substrate using a laser interferometer and controls the residual film thickness dimension based on a measured value.

However, development of a technique that can control the residual film thickness dimension with higher precision is desired.

BRIEF DESCRIPTION OF THE DRAWINGS

FIG. 3A represents a state before the template 100 is pressed onto the transfer portion 111.

DETAILED DESCRIPTION

Figure 1:
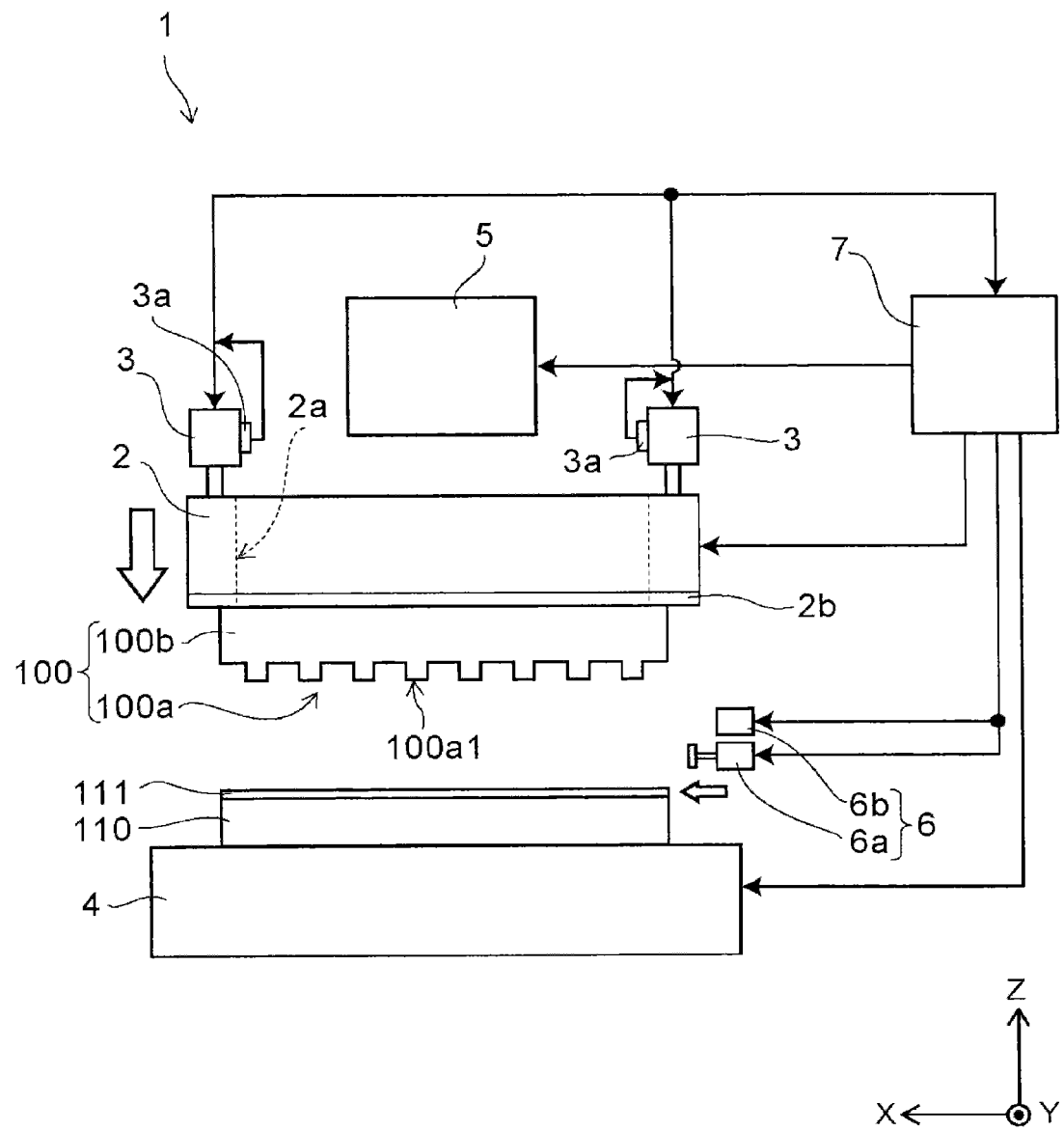
FIG. 1 is a schematic view illustrating an imprint device 1 according to an embodiment.

In general, according to one embodiment, an imprint device includes a holding unit, a mounting unit, a moving unit, a curing unit, a pressing portion, and a detecting portion.

The holding unit holds template having a pattern portion pressed onto a transfer portion provided on a substrate.

The mounting unit is provided facing the holding unit. The mounting unit mounts the substrate.

The moving unit is provided on at least either the holding unit or the mounting unit. The moving unit moves the holding unit and the mounting unit in directions approaching each other or directions away from each other.

The curing unit cures the transfer portion onto which the pattern portion of the template is pressed.

The pressing portion pushes the template pressed onto the transfer portion in a direction intersecting a pressing direction of the template.

The detecting portion detects a position of the template pushed by the pressing portion.

Embodiments will now be described with reference to the drawings. Note that the same numerals are applied to similar constituent elements in the drawings and detailed descriptions of such constituent elements are appropriately omitted.

FIG. 1 is a schematic view illustrating an imprint device 1 according to an embodiment.

The imprint device 1 is an imprint device that transfers using an ultraviolet (UV) imprint method.

A template 100 has a base portion 100b exhibiting a plate shape and a pattern portion 100a provided on one face of the base portion 100b. The pattern portion 100a is pressed onto a transfer portion 111 provided on a substrate 110.

The template 100 is formed from a material that can transmit an ultraviolet ray, such as quartz or the like.

While the base portion 100b exhibiting the plate shape is illustrated, the base portion 100b can be one in which a thickness of a region where the pattern portion 100a is provided is made thin.

The substrate 110 can be made to be, for example, a semiconductor wafer, a glass substrate, or the like.

The transfer portion 111 is provided on one face of the substrate 110.

The transfer portion 111 can include an ultraviolet curing resin.

Before curing, the transfer portion 111 is in a liquid state.

A transfer portion 111 of a film shape is illustrated, but the transfer portion 111 can be a form where an ultraviolet curing resin in a droplet state is provided in a plurality.

As illustrated in FIG. 1, the imprint device 1 is provided with a holding unit 2, a moving unit 3, a mounting unit 4, a curing unit 5, a measuring unit 6, and a control unit 7.

The arrows X, Y, and Z in FIG. 1 represent three mutually perpendicular directions; for example, the arrows X, Y represent a horizontal direction, and the arrow Z represents a vertical direction.

The holding unit 2 holds the base portion 100b of the template 100 via a buffer portion 2b. The holding unit 2 can be, for example, the one that has a chuck that mechanically holds the base portion 100b.

The buffer portion 2b is formed from a material having flexibility, such as an organic material. By providing a buffer portion 2b having flexibility, the template 100 can be made to follow a surface shape of the substrate 110. Because of this, transfer failures can be reduced.

The buffer portion 2b can also be provided on the template 100. Moreover, the holding unit 2 has a hole portion 2a that penetrates a thickness direction. The hole portion 2a is provided in a position facing the pattern portion 100a of the template 100.

The moving unit 3 moves the holding unit 2 in a direction approaching the mounting unit 4 or moves the holding unit 2 in a direction away from the mounting unit 4. For example, the moving unit 3 lifts the holding unit 2. The moving unit 3 can be the one that has a control motor such as a servo motor or the like.

Furthermore, the moving unit 3 has a position detecting portion 3a. The position detecting portion 3a detects a position of the holding unit 2 and, in addition, a position of a tip face 100a1 of the pattern portion 100a.

The moving unit 3 that moves the holding unit 2 is illustrated, the moving unit 3 may be provided on at least either the holding unit 2 or the mounting unit 4 and move the holding unit 2 and the mounting unit 4 in directions approaching each other or directions away from each other.

The mounting unit 4 faces the holding unit 2. The mounting unit 4 holds the mounted substrate 110. The mounting unit 4 can be, for example, the one that has a vacuum chuck. The mounting unit 4 can also be the one that has a mechanical chuck, an electrostatic chuck, or the like.

Furthermore, the mounting unit 4 can also be the one that changes a position of the mounted substrate 110. The mounting unit 4 can be, for example, an XY table or the like.

The curing unit 5 is provided in a position facing the pattern portion 100a of the template 100, interposing the hole portion 2a of the holding unit 2 therebetween.

The curing unit 5 cures the transfer portion 111 onto which the pattern portion 100a of the template 100 is pressed.

The curing unit 5 irradiates, for example, an ultraviolet ray. The curing unit 5 can be, for example, the one that has an ultraviolet lamp.

The ultraviolet ray irradiated from the curing unit 5 is transmitted through the hole portion 2a and the template 100 and is irradiated to the transfer portion 111 pressed by the template 100.

The measuring unit 6 has a pressing portion 6a and a detecting portion 6b.

The pressing portion 6a pushes a side face of the template 100 in an X-direction at a predetermined pressure.

The pressing portion 6a can be the one that can control a pressing force.

The pressing portion 6a can be the one that has, for example, an air cylinder and a control instrument of air pressure. In this case, the pressing force can be controlled by controlling a pressure of air supplied to the air cylinder by the control instrument of air pressure.

Furthermore, the pressing portion 6a can also be the one having a control motor such as a servo motor and a stress measuring instrument such as a strain gauge. In this case, the pressing force can be controlled by controlling the control motor based on an output from the stress measuring instrument.

The detecting portion 6b detects a position in the X-direction of the template 100 pushed by the pressing portion 6a.

The detecting portion 6b can be, for example, a laser interferometer or the like.

The pressing portion 6a that pushes the side face of the template 100 in the X-direction and the detecting portion 6b that detects the position of the template 100 in the X-direction are illustrated, but the pressing portion 6a may push the side face of the template 100 in a Y-direction and a detecting portion 6b may detect a position of the template 100 in the Y-direction.

Furthermore, the pressing portion 6a may be the one that pushes the side face of the template 100 from a direction inclined relative to the X-direction or the Y-direction.

That is, the pressing portion 6a may push the template 100 pressed onto the transfer portion 111 in a direction intersecting a pressing direction of the template 100.

Here, a residual film thickness dimension can be calculated by seeking a shear force of the transfer portion 111 (shear force of the transfer portion 111 between the tip face 100a1 of the pattern portion 100a and the substrate 110) based on an output from the detecting portion 6b.

Details concerning the calculation of the residual film thickness dimension will be described below.

The control unit 7 controls operations of elements provided in the imprint device 1.

The control unit 7 controls, for example, the following operations.

The control unit 7 controls the holding unit 2 and makes the holding unit 2 hold the template 100.

The control unit 7 controls the moving unit 3 and changes a vertical position of the holding unit 2 and, in addition, a vertical position of the template 100.

The control unit 7 controls the mounting unit 4 and makes the mounting unit 4 hold the substrate 110.

The control unit 7 controls the curing unit 5 and makes the curing unit 5 irradiate the ultraviolet ray toward the transfer portion 111 pressed by the template 100.

The control unit 7 controls the pressing portion 6a and makes the pressing portion 6a push the side face of the template 100.

Furthermore, the control unit 7 calculates the shear force of the transfer portion 111 based on the output from the detecting portion 6b. In this case, the control unit 7 calculates the shear force of the transfer portion 111 from a position of the detected template 100 and a relationship sought in advance between a position of the template 100 and the shear force of the transfer portion 111.

The control unit 7 calculates the residual film thickness dimension from the calculated shear force of the transfer portion 111 and a relationship sought in advance between the shear force of the transfer portion 111 and the residual film thickness dimension.

The control unit 7 determines whether the calculated residual film thickness dimension is within a predetermined range.

If it is determined that the calculated residual film thickness dimension is outside the predetermined range, the control unit 7 calculates a correction value for the position of the holding unit 2 and controls the position of the tip face 100a1 of the pattern portion 100a based on the calculated correction value.

That is, the control unit 7 controls the moving unit 3 and corrects the vertical position of the holding unit 2 (the vertical position of the template 100) and, in addition, corrects the residual film thickness dimension so that the calculated residual film thickness dimension is within the predetermined range.

Additionally, a coating device or the like for forming the transfer portion 111 on the substrate 110 can also be provided.

The coating device may be, for example, an ink-jet device or the like.

Next, the calculation of the residual film thickness dimension will be described.

Before being irradiated by the ultraviolet ray (before curing), the transfer portion 111 is in the liquid state.

Because of this, a portion of the transfer portion 111 that is not contacting the template 100 and the substrate 100 becomes a bulk liquid.

Here, the residual film thickness dimension (distance between the tip face 100a1 of the pattern portion 100a and the substrate 110) is in the order of nanometers. For example, the residual film thickness dimension may be about ten nanometers (nm) to several tens of nm.

If the residual film thickness dimension is long (for example, if the residual film thickness dimension is about several micrometers [μm] long), the bulk liquid does not have an ordered structure because molecules of a material configuring the bulk liquid can move comparatively freely.

Because of this, the shear force of the transfer portion 111 becomes small.

However, if the residual film thickness dimension is in the order of nanometers, a viscosity of the transfer portion 111 increases and, in addition, the shear force of the transfer portion 111 becomes large.

According to findings obtained by the present inventors, with the resin used in the imprint method, if the residual film thickness dimension is in the order of nanometers, a regularity arises in a relationship between the shear force of the transfer portion 111 and the residual film thickness dimension.

Because of this, the residual film thickness dimension can be calculated by measuring the shear force of the transfer portion 111.

Figure 2:
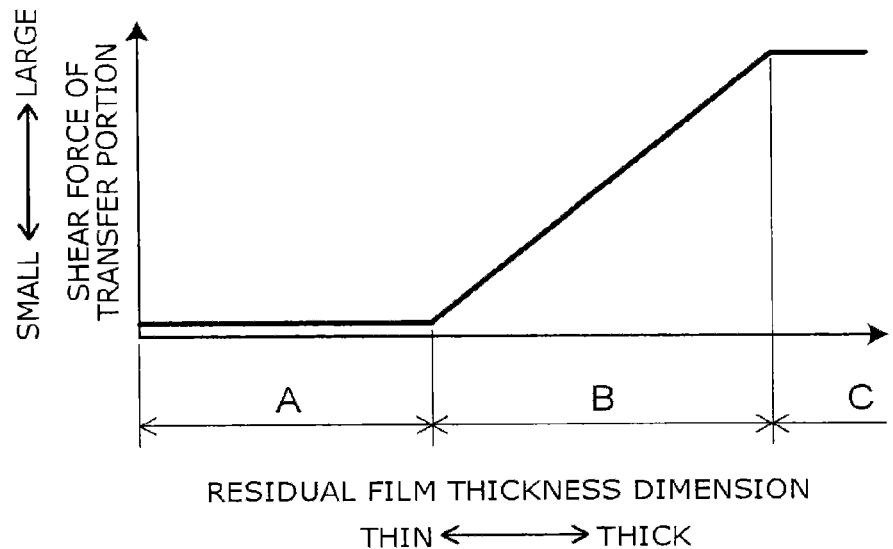
FIG. 2 is a schematic graph showing the relationship between the shear force of the transfer portion 111 and the residual film thickness dimension.

FIG. 2 is a schematic graph showing the relationship between the shear force of the transfer portion 111 and the residual film thickness dimension.

Figure 3A:
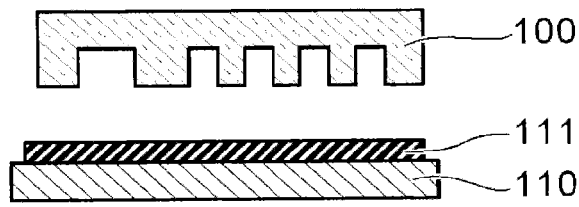
FIGS. 3A to 3C are schematic diagrams illustrating how the residual film thickness dimension changes.
Figure 3B:
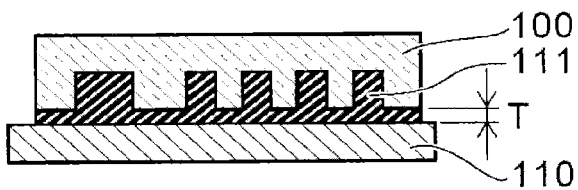
Figure 3C:
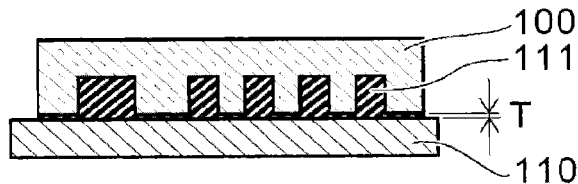

FIGS. 3A to 3C are schematic diagrams illustrating how the residual film thickness dimension changes. FIG. 3A represents a state before the template 100 is pressed onto the transfer portion 111.

As described above, the shear force of the transfer portion 111 is small before the template 100 is pressed onto the transfer portion 111 and if the residual film thickness dimension is long.

For example, as illustrated by region A in FIG. 2, the shear force of the transfer portion 111 becomes small.

As illustrated in FIG. 3B, the shear force of the transfer portion 111 becomes large if the template 100 is moved to a substrate 110 side and a residual film thickness dimension T is made to be short.

Furthermore, as illustrated in FIG. 3C, the shear force of the transfer portion 111 becomes larger if the residual film thickness dimension T is made to be shorter.

In this case, as indicated by region B in FIG. 2, a regularity arises in a relationship between the shear force of the transfer portion 111 and the residual film thickness dimension T.

However, if the residual film thickness dimension T is too short, as indicated by region C in FIG. 2, the shear force of the transfer portion 111 comes to remain large and not fluctuate.

For example, region C in FIG. 2 is a region where the position of the template 100 does not change by merely pushing the side face of the template 100 with the pressing portion 6a.

Region B in FIG. 2 in the resin used in the imprint method (region where the regularity arises in the relationship between the shear force of the transfer portion 111 and the residual film thickness dimension T) is a region including a residual film thickness dimension that is normally used (about ten nm to several tens of nm).

Therefore, because the residual film thickness dimension T at a time when the shear force of the transfer portion 111 is measured can be specified by measuring the shear force of the transfer portion 111, it becomes possible to control the residual film thickness dimension T with high precision.

In region B in FIG. 2, a situation is illustrated where the relationship between the shear force of the transfer portion 111 and the residual film thickness dimension T is linear, but the relationship is not limited thereto.

Furthermore, the relationship between the shear force of the transfer portion 111 and the residual film thickness dimension T can be affected by a material, viscosity, component ratio, and the like of the transfer portion 111.

Because of this, it is preferable to seek in advance the relationship between the shear force of the transfer portion 111 and the residual film thickness dimension T by performing experiments and simulations.

Next, the shear force of the transfer portion 111 can be sought in the following manner.

When the pressing portion 6a pushes the side face of the template 100 at a predetermined pressure, the position of the template 100 changes.

In this case, the change of the position of the template 100 can be affected by the shear force of the transfer portion 111, an elasticity of the template 100, an elasticity of the buffer portion 2b, and the like.

As described above, the shear force of the transfer portion 111 changes by a change of the residual film thickness dimension T. In contrast, it is considered that the elasticity of the template 100, the elasticity of the buffer portion 2b, and the like are substantially constant even when the residual film thickness dimension T changes.

Because of this, influences of the elasticity of the template 100, the elasticity of the buffer portion 2b, and the like can be removed.

Furthermore, by seeking in advance a relationship between the position of the template 100 when a predetermined pressing force is applied and the shear force of the transfer portion 111 by performing experiments and simulations, the shear force of the transfer portion 111 can be calculated based on the output from the detecting portion 6b.

Next, an action of the imprint device 1 and a pattern forming method according to the embodiment will be illustrated.

First, the substrate 110 that has the transfer portion 111 is mounted on the mounting unit 4 by a conveyance device (not illustrated).

The transfer portion 111 can be formed on the one face of the substrate 110 using the ink-jet device or the like.

Next, the moving unit 3 moves the holding unit 2 in the direction approaching the mounting unit 4.

At this time, the position of the holding unit 2 and, in addition, the position of the tip face 100a1 of the pattern portion 100a are controlled to be in predetermined positions based on an output from the position detecting portion 3a.

That is, the position of the tip face 100a1 of the pattern portion 100a is controlled so as to make a desired residual film thickness dimension T.

Next, the pressing portion 6a pushes the side face of the template 100.

At this time, the pressing force is controlled to be a predetermined value.

Next, the detecting portion 6b detects the position of the template 100.

Then, the control unit 7 calculates the shear force of the transfer portion 111 based on the output from the detecting portion 6b.

Furthermore, the control unit 7 calculates the residual film thickness dimension T based on the calculated shear force of the transfer portion 111.

If the control unit 7 determines that the calculated residual film thickness dimension T is within a predetermined range, curing that will be described below is performed.

Meanwhile, if the control unit 7 determines that the calculated residual film thickness dimension T is outside the predetermined range, the control unit 7 corrects the residual film thickness dimension T.

When correcting the residual film thickness dimension T, first, the control unit 7 calculates the correction value for the position of the holding unit 2. For example, if the residual film thickness dimension T is too short, the control unit 7 calculates a suitable position in a rising direction for the holding unit 2. If the residual film thickness dimension T is too long, the control unit 7 calculates a suitable position in a lowering direction for the holding unit 2.

Next, the control unit 7 controls the position of the holding unit 2 and, in addition, the position of the tip face 100a1 of the pattern portion 100a based on the calculated correction value for the position of the holding unit 2.

Next, the control unit 7 recalculates the residual film thickness dimension T in a manner similar to that described above.

Hereinafter, the residual film thickness dimension T is made to fall within the predetermined range by repeating the procedures described above as needed.

Next, the curing unit 5 irradiates the ultraviolet ray to the transfer portion 111 pressed by the template 100.

The transfer portion 111 cures by being irradiated with the ultraviolet ray, and a pattern of the pattern portion 100a is transferred onto the transfer portion 111.

Next, the moving unit 3 moves the holding unit 2 in the direction away from the mounting unit 4.

Next, the conveyance device that is not illustrated conveys the substrate 110 having the transfer portion 111 onto which the pattern is transferred.

Hereinafter, the pattern of the pattern portion 100a can be continuously transferred onto the transfer portion 111 by repeating the procedures above.

As described above, the pattern forming method according to the embodiment can have the following processes of:
forming the transfer portion 111 on the substrate 110;
pressing the pattern portion 100a of the template 100 onto the transfer portion 111;
pushing the template 100 pressed onto the transfer portion 111 in the direction intersecting the pressing direction of the template 100;
detecting the position of the pushed template 100; and
curing the transfer portion 111 onto which the pattern portion 100a of the template 100 is pressed.

Furthermore, the pattern forming method according to the embodiment can further have the following processes of:
calculating the shear force of the transfer portion 111 from the detected position of the template 100 and the relationship sought in advance between the position of the template 100 and the shear force of the transfer portion 111;
calculating the residual film thickness dimension T from the calculated shear force of the transfer portion 111 and the relationship sought in advance between the shear force of the transfer portion 111 and the residual film thickness dimension T;
determining whether the calculated residual film thickness dimension T is within the predetermined range; and
correcting the residual film thickness dimension T by changing the position in the pressing direction of the template 100 when the calculated residual film thickness dimension T is determined to be outside the predetermined range.

A content of each process can be made to be similar to that described above; therefore, description of the content of each process will be omitted.

Furthermore, in the above, a situation of a UV imprint method is illustrated, but a situation of a thermal imprint method can similarly calculate the residual film thickness dimension T and control the residual film thickness dimension T. For example, in a situation where the imprint device 1 is an imprint device that transfers using the thermal imprint method, the curing unit 5 can be the one that irradiates a far infrared ray.

Note that a heating method is not limited to irradiation of the far infrared ray and can be suitably modified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A pattern forming method, comprising:
   forming a transfer portion on a substrate;
   pressing a pattern portion of a template onto the transfer portion;
   pushing the template pressed onto the transfer portion in a direction intersecting a pressing direction of the template;
   detecting a position of the pushed template;
   calculating a shear force of the transfer portion from the detected position of the template and a relationship sought in advance between a position of the template and the shear force of the transfer portion;
   calculating a residual film thickness dimension from the calculated shear force of the transfer portion and a relationship sought in advance between a shear force of the transfer portion and the residual film thickness dimension; and
   curing the transfer portion onto which the pattern portion of the template is pressed.

2. The method according to claim 1, further comprising:
   determining whether the calculated residual film thickness dimension is within a predetermined range.

3. The method according to claim 2, further comprising:
correcting the residual film thickness dimension by changing the position in the pressing direction of the template when the calculated residual film thickness dimension is determined to be outside the predetermined range.

4. The method according to claim 3, wherein in the correcting the residual film thickness dimension, a correction value for the position in the pressing direction of the template is calculated and the position in the pressing direction of the template is changed based on the calculated correction value.

5. The method according to claim 1, wherein the residual film thickness dimension is in the order of nanometers.

6. The method according to claim 1, wherein the shear force of the transfer portion is a shear force of the transfer portion between a tip face of the pattern portion and the substrate.

7. The method according to claim 1, wherein
the transfer portion includes a resin, and
a portion of the transfer portion that is not contacting the template and the substrate is a bulk liquid.

\* \* \* \* \*